(12) United States Patent
Buss et al.

(10) Patent No.: US 7,005,880 B1
(45) Date of Patent: Feb. 28, 2006

(54) METHOD OF TESTING ELECTRONIC WAFERS HAVING LEAD-FREE SOLDER CONTACTS

(75) Inventors: Brian Lee Buss, Emmaus, PA (US); Robert Dale Ickes, Jr., Blandon, PA (US); Wayne Alan Rademacher, Jordon, MN (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/097,796

(22) Filed: Apr. 2, 2005

(51) Int. Cl.
*G01R 31/26* (2006.01)
(52) U.S. Cl. .................................................. 324/765
(58) Field of Classification Search ...................... None
See application file for complete search history.

(56) References Cited

U.S. PATENT DOCUMENTS 6,452,400 B1 * 9/2002 Kawai et al. ............... 324/459

OTHER PUBLICATIONS

O. Weeden, "Probe Card Tutorial," pp. 1,3,16,29-31,40 (2003), found at the website of *Keithley Instruments, Inc.* at URL: http://keithley.com/servlet/Data?id=13263.

P. W. Seitzer, "Alternatives to Vertical Probing," pp. 1, 6 (2000), found at the website of the *Southwest Test Workshop* at the website URL: http://www.swtest.org/swtw_library/2000proc/PDF/Intro_2000.pdf.

* cited by examiner

*Primary Examiner*—Zandra V. Smith
*Assistant Examiner*—Roberto Velez

(57) ABSTRACT

A cantilever probe method of parametrically testing wafers extends the probe tip cleaning interval, maintains relatively low contact resistance, and reduces contact resistance variability. In one embodiment of our invention, a method of testing electronic circuits formed in a wafer having lead-free terminals, comprises the steps of exposing the terminals to a plasma containing oxygen; providing a test apparatus having cantilevered probes for contacting the terminals; each probe having a cantilevered probe arm and a BeCu probe tip extending from the arm at an acute angle $\alpha$; the angle $\alpha$ being designed to essentially eliminate sliding movement of the probe tip when in contact with a terminal; and bringing the probe tips into contact with selected ones of the terminals, so as to perform electrical tests on the wafer; and, during the contacting step, exposing the probe tips to a flow of a non-oxidizing gas (e.g, nitrogen, argon). In a preferred embodiment, the terminals are Sn-based solder bumps. In another preferred embodiment the angle $\alpha$ is approximately 87°–90°.

12 Claims, 5 Drawing Sheets

US 7,005,880 B1

METHOD OF TESTING ELECTRONIC WAFERS HAVING LEAD-FREE SOLDER CONTACTS

BACKGROUND OF THE INVENTION

1. Field of the Invention

This invention relates to a method of testing electronic circuits and/or semiconductor devices in wafer form and, more particularly, to a method of testing such circuits/devices in wafers having lead-free solder bump contacts.

2. Discussion of the Related Art

In the industry of semiconductor devices (e.g., integrated circuits and discrete devices) it is common to parametrically test the circuits/devices while they are still an integral part of a semiconductor wafer; that is, before the wafer has been diced into individual circuits or chips. To do so, the test apparatus typically includes a probe card, which has a nest of electrical probes that enable the apparatus to make electrical contact with a subset of terminals (e.g., bond pads, solder bumps) on the wafer. Once testing of a subset of terminals is complete, the wafer is moved laterally relative to the probe card (e.g., via a well known stepper machine) so that another subset of terminals can be accessed by the test apparatus. This sequential process is repeated until all of the terminals that need to be tested are in fact probed by the test apparatus.

Two of the most common types of probe cards in the industry are the vertical probe card and the cantilever probe card. FIG. 1 shows a vertical probe card 10 for parametrically testing circuits or devices in a wafer 10.1 via terminals 10.6 (e.g., solder bump contacts) located on a major surface of the wafer. The card 10 includes a printed circuit board (PCB) 10.3 coupled to a probe head 10.2 via a probe router-substrate 10.4. A wafer prober (not shown) moves the wafer 10.1 laterally (arrow 10.7) to position a particular subset of terminals 10.6 under the probe head and then moves the wafer vertically (arrow 10.9) to bring the probes 10.5 into contact with the selected subset of terminals 10.6. Test signals from a controller (not shown) are delivered to the circuits or devices in the wafer via the electrical paths formed by the PCB 10.3, the router-substrate 10.4, the probes 10.5 and the subset of terminals 10.6. Response signals from the tested circuits/devices are received by the controller, stored and then analyzed by a computer.

In contrast, FIG. 2 shows a cantilever probe card 20 for parametrically testing circuits or devices in a wafer 20.1 via terminals 20.6. The card 20 includes a printed circuit board (PCB) 20.3 having an aperture 20.8. A nest of probes 20.5 is disposed within the aperture 20.8, as shown in FIG. 3. A wafer prober (not shown) moves the wafer 20.1 laterally (arrow 20.7) to position a particular subset of terminals 20.6 under the probe head and the moves the wafer vertically (arrow 20.9) to bring the probes 20.5 into contact with the selected subset of terminals 20.6. Test signals from a controller (not shown) are delivered to the circuits or devices in the wafer via the electrical paths formed by the PCB 20.3, the probes 20.5 and the subset of terminals 20.6. As above, response signals from the tested circuits/devices are received by the controller, stored and then analyzed by a computer.

When the semiconductor devices are sensitive to contact resistance, as many are, such parametric testing apparatus has a persistent problem—the probe tips become contaminated and/or worn, necessitating frequent cleaning and/or replacement. Although the vertical probe card design can provide reliable contact resistance and an acceptable number of probe tip cleanings, it is an expensive solution; that is, complex fabrication techniques are required to manufacture the head 10.2 and the router-substrate 10.4. Illustratively, the cost of a vertical probe card is $15,000 to $30,000. On the other hand, cantilever probe cards are less expensive initially (e.g., $3,000 to $4,000), but require frequent probe tip cleanings, which reduces probe tip life. Consequently, the probe nest has to be replaced frequently.

In addition, incorrectly setting the probe cleaning interval can adversely affect yield. Cleaning intervals are usually set assuming a specific distribution of cleaning frequencies and, by inference, the terminal material properties. Yield can be adversely affected by changes in device parameters that are influenced by increased contact resistance; e.g., manufacturing variations in the composition of the terminals can potentially impact the cleaning frequency by the way material accumulates on the probes and the corresponding increase of contact resistance prior to the predicted cleaning interval.

BRIEF SUMMARY OF THE INVENTION

In accordance with one aspect of our invention, we have devised a cantilever probe method of parametrically testing wafers that extends the probe tip cleaning interval, maintains relatively low contact resistance, and reduces contact resistance variability. In one embodiment of our invention, a method of testing electronic circuits, formed in a wafer having lead-free terminals, comprises the steps of: exposing the terminals to a plasma containing oxygen; providing a test apparatus having probes for contacting the terminals; and bringing the probe tips into contact with selected ones of the terminals, so as to perform electrical tests on the wafer; and, during the contacting step, exposing the probe tips to the flow of a non-oxidizing gas (e.g., nitrogen, argon). In a preferred embodiment, the terminals are Sn-based solder bumps. In another preferred embodiment, the probe tip comprises BeCu. In yet another preferred embodiment, each probe has a cantilevered probe arm and a probe tip extending from the arm at an acute angle $\alpha$, the angle $\alpha$ being designed to essentially eliminate sliding movement of the probe tip when in contact with a terminal. Illustratively, the angle $\alpha$ is approximately 87°–90°.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

Figure 4:
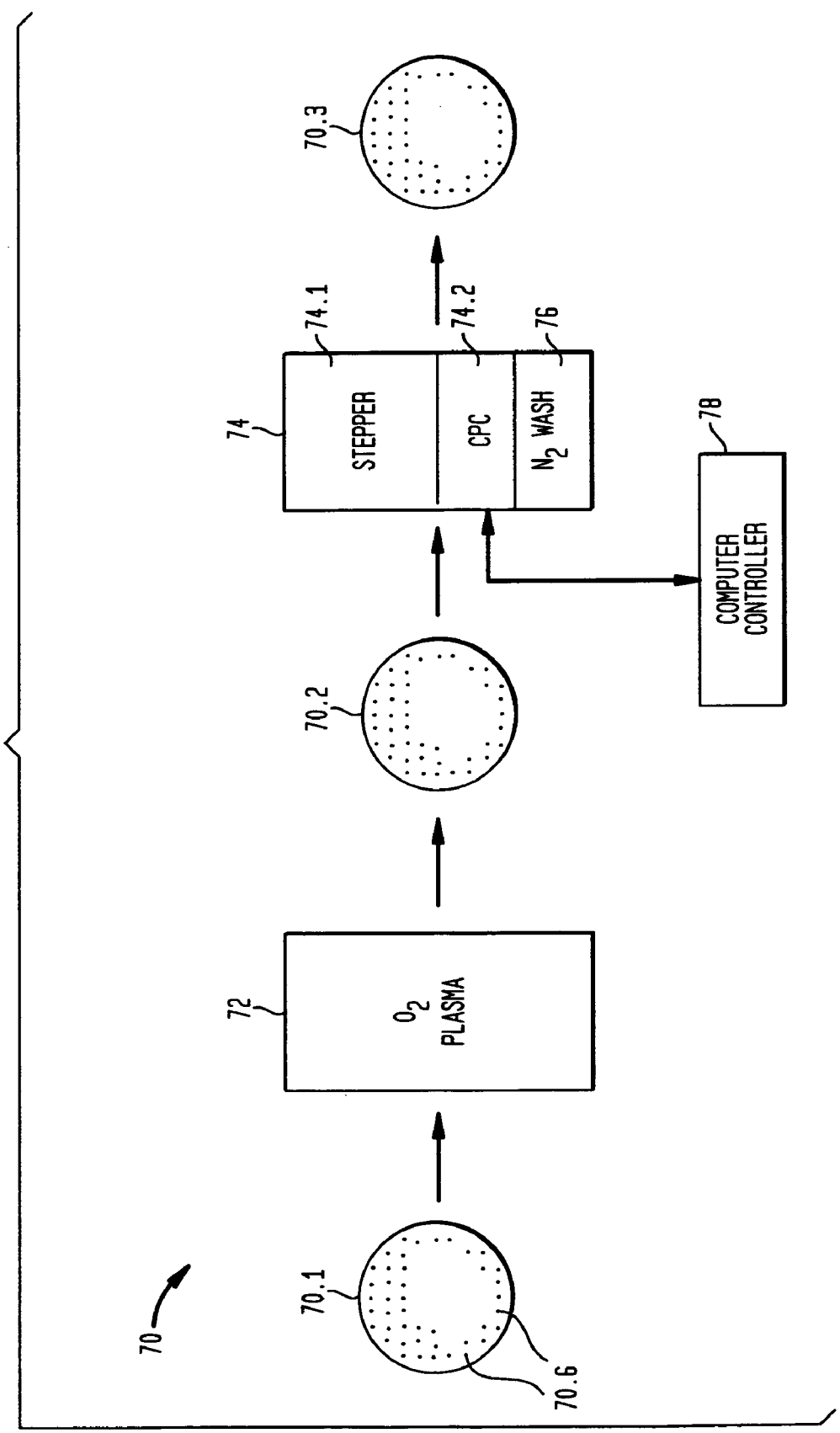
FIG. 4 is a block diagram of a test system used in the description of the primary process steps involved in implementing one embodiment of our invention.

With reference now to FIG. 4, we show schematically a block diagram of a test system 70 utilized in the practice of an illustrative embodiment of our invention. In particular, an electronic wafer 70.1 includes a multiplicity of lead-free, metallic electrical terminals 70.6 such as, for example, ball grid arrays (BGAs) or solder bumps. These terminals allow electrical test/response signals to flow into/out of electronic circuits and/or semiconductor devices (not shown) in the wafer.

Before any such tests are performed, however, the wafer enters a first station—an oxygen plasma chamber 72—where a relatively thin, dense oxide is formed on the terminals 70.6, while the wafer is maintained at approximately room temperature (e.g., ~25° C.). Note, the interstitial region between the terminals is typically covered by a passivation layer (e.g., silicon nitride), which prevents oxide formation in the interstices. The oxide is denser than the native oxide that would be formed by merely exposure to the atmosphere. The dense oxide provides a non-stick coating to prevent terminal material (i.e., metal and/or metal oxide) from adhering to the probe tip, as discussed below. In addition, because the oxide is plasma deposited, its physical characteristics (thickness, density) are more controllable than those of a native oxide.

Figure 1:
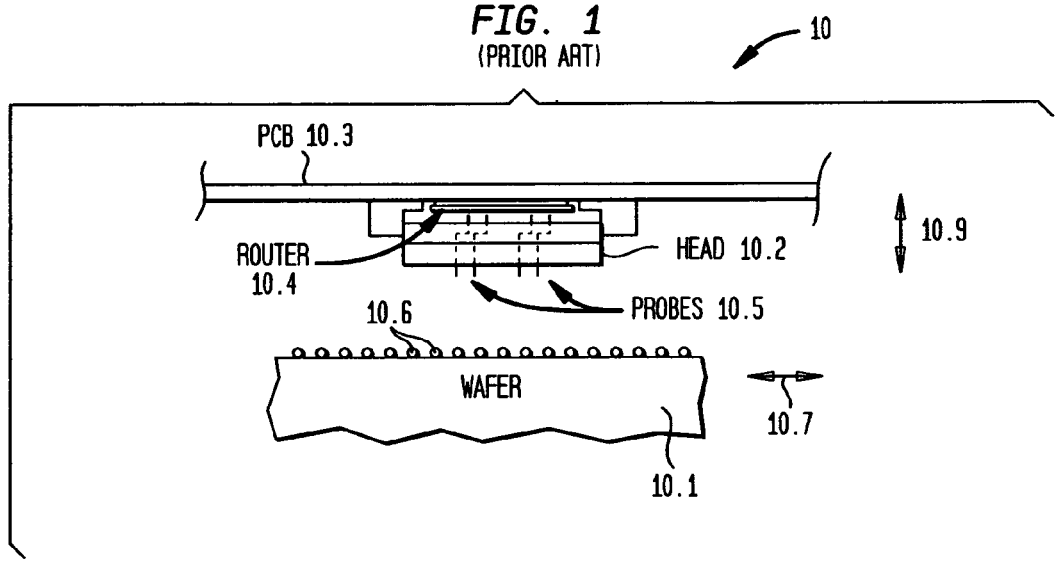
FIG. 1 is a schematic, cross sectional view of a prior art vertical probe card.
Figure 2:
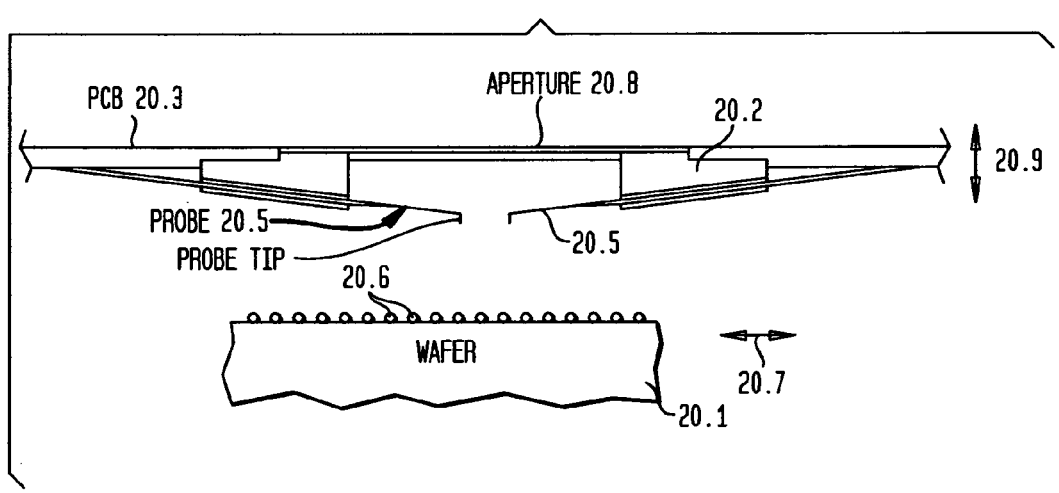
FIG. 2 is a schematic, cross sectional view of a prior art cantilever probe card.
Figure 3:
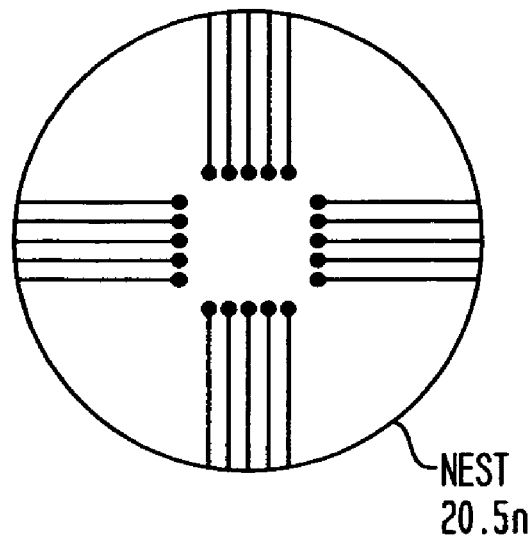
FIG. 3 is a schematic top view of a probe nest of a prior art cantilever probe card.
Figure 5:
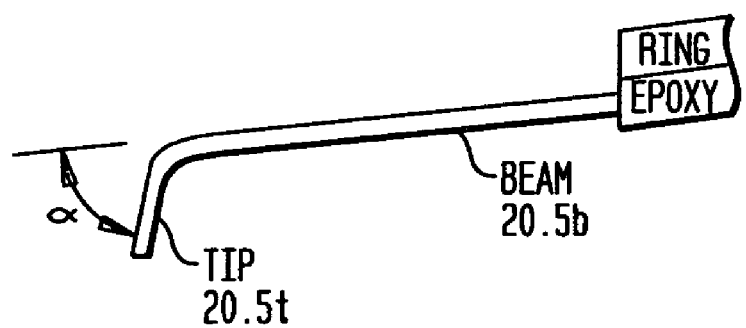
FIG. 5 is a side view of a cantilever probe in accordance with one embodiment of our invention.

After the terminals have been suitably oxidized, the oxidized wafer 70.2 is moved to a second station—where several process steps are performed. First, the wafer 70.2 is mounted on a cantilevered probe card (CPC) 74.2 of the type shown in FIGS. 2–4, but modified so that the acute angle α between each probe arm/beam and its corresponding probe tip is approximately 87°–90° in order to essentially eliminate probe tip movement, or scrubbing, when a probe tip is in contact with a terminal. The action of scrubbing, which is the sliding of the probe tip across the terminal during overdrive, scrapes off metal and/or metal oxide from the terminal, thereby exposing the underlying metal or metal alloy, which, however, is then immediately oxidized. Overdrive is tip pressure beyond that required to produce initial contact of the probe tip with the terminal.

In the prior art, when a probe tip makes contact with a terminal that is covered with a native oxide, it flattens the top of the terminal and breaks the oxide. The probe metal and/or metal oxide tends to adhere to and accumulate on the probe tip. This oxide accumulation is undesirable because it tends to alter contact resistance in an unknown amount and in an uncontrollable fashion. In contrast, our denser, plasma oxide is sufficiently thin that it can still be broken by the probe tip to expose the underlying metal/alloy but advantageously does not stick to the probe tip. Avoiding oxide accumulation not only renders test measurements more accurate (especially those sensitive to contact resistance), but also significantly reduces the frequency that the probe tips have to be cleaned. Fewer cleanings means fewer process steps and hence lower cost. It also means that the probe tips, which are cleaned with an abrasive material, do not wear out as quickly. Since CPCs are expensive, not having to replace the probe nest as frequently also lowers cost. To this end, we also prefer that the probe tip be made of BeCu, which sheds oxide material better than other alloys such as tungsten-rhenium (WRe).

At the second station (a wafer prober 74), a computer controller 78 instructs a conventional stepper 74.1 to move the oxidized wafer 70.2 so that a particular subset of terminals 70.6 is positioned under the probe nest of the CPC 74.2. The controller 78 then instructs the CPC 74.2 to bring the probe nest into contact with the desired subset of terminals 70.6. (Typically the subset corresponds to all of the terminals associated with a particular die.) Test signals from the controller are applied to the selected subset of terminals, and response signals from the circuits/devices in the wafer 70.2 are received by the controller 78, stored in memory, and analyzed. (Typically these signals test the functionality of the circuits/devices.) Subsequently, the controller 78 causes the stepper 74.1 to move the wafer 70.2 to bring a second subset of terminals into contact with the CPC 74.2, and the testing process is repeated until all of the desired tests have been performed. Once all of the tests of the circuits/devices of a wafer 70.2 are completed, the tested wafer 70.3 moves on to a third station (not shown) for additional processing (e.g., dicing), if necessary or desirable.

Also, at the second station, during all of the probing processes, a source 76 of a non-oxidizing gas (e.g., nitrogen, argon) produces a flow of non-oxidizing gas over the probe tips. The non-oxidizing gas flow rate is sufficient to create a positive pressure of that gas around the probe tips, thereby evacuating atmospheric oxygen from the region proximate the probe tips. By removing oxygen from the tip region, we effectively reduce, if not eliminate, oxidation of the terminal metal/alloy that is exposed after the oxide is broken by the probe tip.

We offer the following theoretical explanation of the chemical and physical phenomena involved in the practice of our testing process, without, however, intending to limit the scope of our invention thereby. For purposes of discussion we assume the terminals are tin-based, lead-free solder bumps, the non-oxidizing gas is nitrogen, and the probe tips are made of BeCu. More specifically, during the probing operation, tin and tin oxide are transferred from the terminals to the probe tips. Due to a number of factors (e.g., the tendency of BeCu to form relatively weak copper oxides, the flow of nitrogen, and the density of the plasma-grown tin oxide) accumulation of tin oxide on the probe tips is greatly reduced. We believe that low accumulation is caused by the reduction of copper oxide on the BeCu probe tips by nitrogen, which reduces charge attraction between the probe tip and the tin and/or tin oxide.

EXAMPLE

This example describes a method of testing electronic eight-inch wafers having lead-free, solder bumps, in accordance with one embodiment of our invention. Each wafer contained about 2500 integrated circuits (dies) that performed pre-amplifier functions. Various materials, dimensions and operating conditions are provided by way of illustration only and, unless otherwise expressly stated, are not intended to limit the scope of the invention.

More specifically, the electronic wafers had metal solder bumps comprising a 95% Sn-3.5% Ag-1.5% Cu alloy. The wafers were maintained at about 25° C. and were oxidized in a commercially available plasma reactor under the following conditions:

| | |
|---|---|
| RF power | 475 Watts |
| Vacuum | 138 mTorr |
| $O_2$ flow rate | 80 cc/mm @ 5–10 psi |

-continued

| Plasma mode | Downstream |
|---|---|
| Time | ≧1 min |

Figure 6:
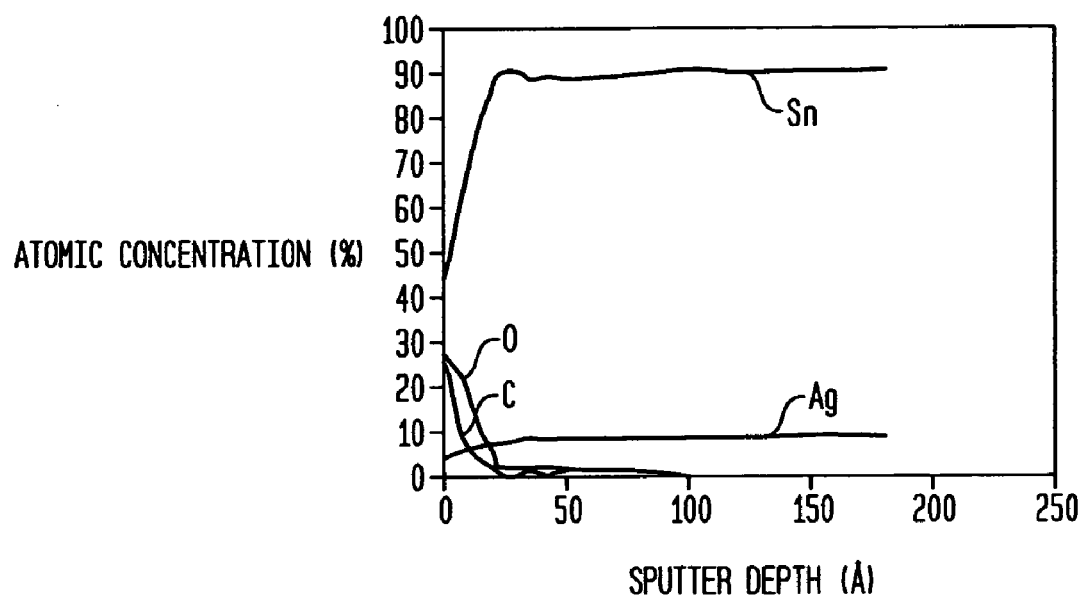
FIG. 6 is a graph of the atomic concentration of tin, oxygen, carbon and silver in a Sn-based solder bump before exposure to an oxygen plasma.
Figure 7:
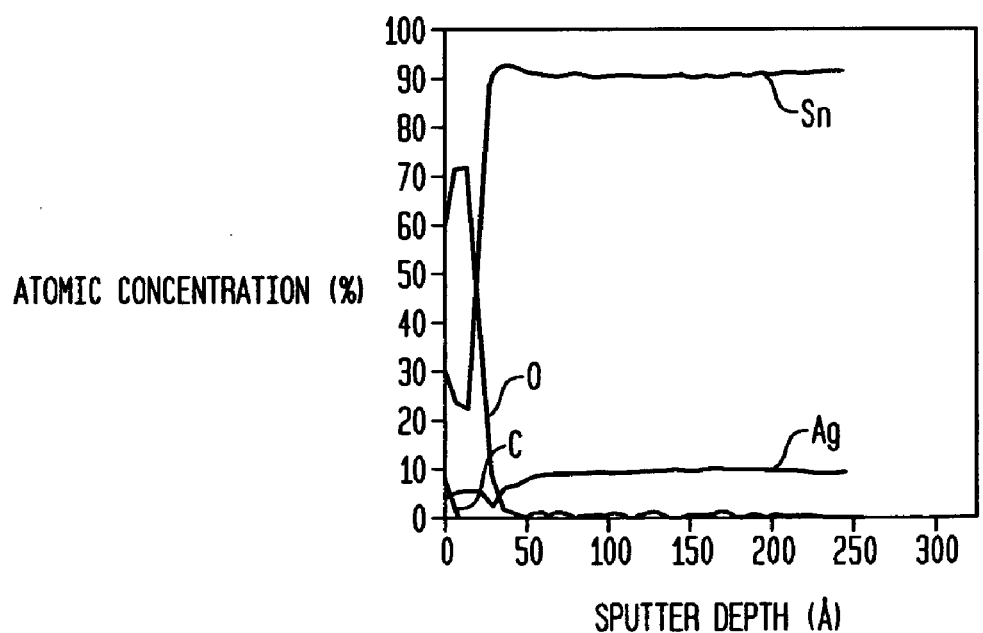
FIG. 7 is a graph of the atomic concentration of tin, oxygen, carbon and silver in a Sn-based solder bump after exposure to an oxygen plasma, in accordance with one embodiment of our invention.

To demonstrate the effect of the plasma process we turn to FIGS. 6–7, which are Auger depth profiles of the wafer before (FIG. 6) and after (FIG. 7) it had been subjected to the oxygen plasma. The principal changes of interest occurred within a distance of less than approximately 50 Å of the wafer surface. More specifically, the relative proportion (atomic concentration) of oxygen increases, and the relative proportion of tin decreases, within about the first 25 Å, which is consistent with the conversion of tin to tin-oxide. The density of the oxide layer is reflected by the fact that the atomic concentration of tin ranged from about 60% at the surface to about 48% at a depth of about 25 Å, whereas the corresponding atomic concentration of oxygen ranged from about 30% to 48%.

Little change was observed in the relative proportion of silver, but a significant decrease in the relative proportion of carbon was seen [representing the fact that the plasma removed some of the inevitably present organic contamination (e.g., polymers or solvents) from the surface].

During functional testing of the preamplifiers on the wafers using a CPC, the probe tips were subjected to a nitrogen flow of about 5–10 SCFH (standard cubic feet per hour).

After repeating our testing process on many wafers, we observed that we had extended the probe tip cleaning cycle from testing approximately every 30 dies to testing in excess of 250 dies. In addition, our process reduced the amount of probe tip material that was consumed (worn off) during product testing and increased the efficiency of the test system by reducing the amount of time spent cleaning the probes.

Finally, our testing process maintained the contact resistance $R_c$ relatively low (e.g., <0.5 Ω) and reduced its variability. Note, that $R_c$ is defined as the absolute bump-to-probe resistance after all other series resistance in the measurement circuit has been nulled out. Due to resistances of wire, PCB trace, on-chip metallization, etc. the initial baseline resistance may exceed, for example, 3–4 Ω. All measurements used in FIG. 8, which is discussed below, are referenced to this initial resistance value to determine the specific absolute bump-to-probe resistance.

Figure 8:
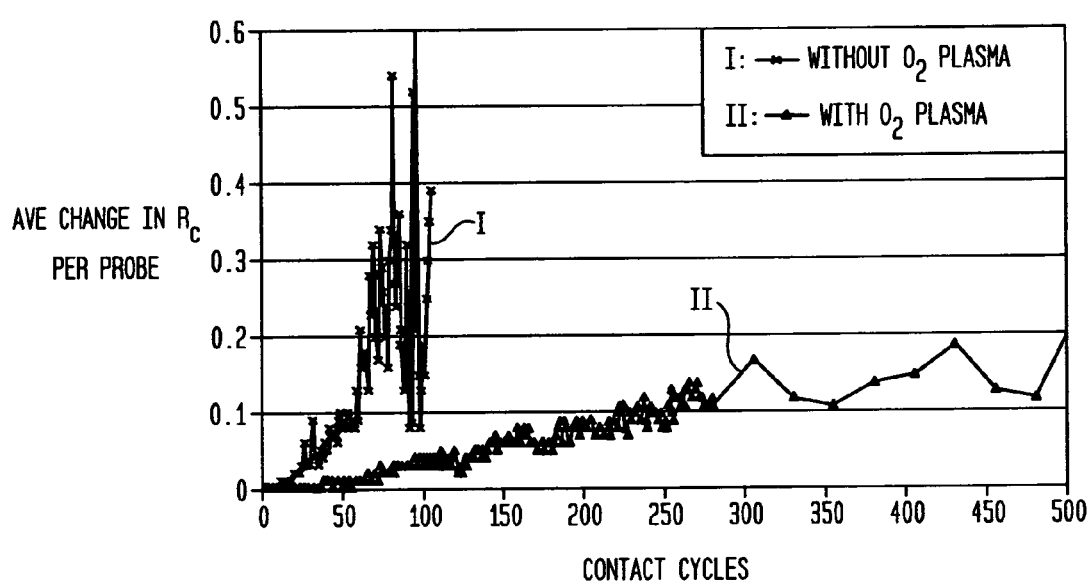
FIG. 8 is a graph of the change in contact resistance versus the number of contact cycles for wafers in which lead-free, solder bump contacts were subjected to an oxygen plasma at room temperature (Curve II), in accordance with one embodiment of our invention, and for similar wafers not subjected to an oxygen plasma (Curve I). A contact cycle is defined as one touch of a probe tip to a solder bump.

FIG. 8 compares two cases: Curve I (no oxygen plasma) and Curve II (oxygen plasma). More specifically, Curve I shows the average change in $R_c$ per probe ($\Delta R_c$) for lead-free, tin-based solder bump contacts not subjected to an oxygen plasma but including a nitrogen flow during probing. Note, $\Delta R_c$ was relatively high; that is, after about 60 contact cycles $\Delta R_c$ exceeded about 0.1 (10%), and at 100 contact cycles it exceeded 0.5 (50%) in some cases. In addition, above about 60 contact cycles $\Delta R_c$ was highly variable and unstable, bouncing around between 0.08 (8%) and 0.55 (55%). On the other hand, Curve II shows $\Delta R_c$ for similar lead-free, tin-based solder bump contacts subjected to both an oxygen plasma and nitrogen flow, in accordance with one embodiment of our invention. Note, $\Delta R_c$ did not exceed 0.1 (10%) until more than about 250 contact cycles, and the variability of $\Delta R_c$ was much less than $\Delta R_c$ for the solder bumps of Curve I.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

We claim:

1. A method of testing electronic circuits formed in a wafer having lead-free solder terminals, the method comprising the steps of:
    (a) exposing the terminals to a plasma containing oxygen;
    (b) providing a test apparatus having probes for contacting the terminals;
    (c) bringing the probe tips into contact with selected ones of the terminals, so as to perform electrical tests on the wafer; and
    (d) during step (c) exposing the probe tips to a flow of a non-oxidizing gas.

2. The method of claim 1, wherein the terminals are Sn-based solder bumps.

3. The method of claim 2, wherein the solder bumps comprise an alloy of Sn, Ag and Cu.

4. The method of claim 1, wherein each probe has a cantilevered probe arm and a probe tip extending from the arm at an acute angle α, the angle α being designed to essentially eliminate sliding movement of the probe tip when in contact with a terminal.

5. The method of claim 4, wherein said probe tip comprises BeCu.

6. The method of claim 4, wherein the angle α is approximately 87°–90°.

7. The method of claim 2, wherein the oxygen plasma is sufficient to form a thin, dense tin oxide on the surface of the solder bumps.

8. The method of claim 7, wherein the oxygen plasma is formed in an RF reactor having an RF input power of the order of 100s of watts, a vacuum of the order to 100 mTorr, an input oxygen flow rate of the order of 100 cc/min at a pressure of about 5–10 psi, for a time of at least 1 minute.

9. The method of claim 1, wherein said non-oxidizing gas comprises nitrogen.

10. The method of claim 9, wherein the nitrogen flow rate is sufficient to evacuate most of the oxygen from the area of the probe tips.

11. The method of claim 10, wherein the nitrogen flow rate is about 5–10 SCFH.

12. A method of testing electronic circuits formed in a wafer having lead-free, Sn—Ag—Cu alloy solder bump terminals, the method comprising the steps of:
    (e) exposing the terminals to a plasma containing oxygen to form a Sn oxide layer on the bumps; the exposing step taking place in an RF reactor having an RF input power of the order of 100s of watts, a vacuum of the order to 100 mTorr, an input oxygen flow rate of the order of 100 cc/min at a pressure of about 5–10 psi, for a time of at least 1 minute;
    (f) providing a test apparatus having cantilevered probes for contacting the terminals; each probe having a cantilevered probe arm and a BeCu probe tip extending from the arm at an acute angle α; where $87° \leq α \leq 90°$ so as to essentially eliminate sliding movement of the probe tip when in contact with a terminal; and
    (g) bringing the probe tips into contact with selected ones of the terminals, so as to perform electrical tests on said wafer; and
    (h) during step (g) exposing the probe tips to a flow of nitrogen at a rate of about 5–10 SCFH.

* * * * *